(12) United States Patent
Suligoj et al.

(10) Patent No.: US 7,038,249 B2
(45) Date of Patent: May 2, 2006

(54) HORIZONTAL CURRENT BIPOLAR TRANSISTOR AND FABRICATION METHOD

(75) Inventors: Tomislav Suligoj, Zagreb (HR); Petar Biljanovic, Zagreb (HR); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 49 days.

(21) Appl. No.: 10/677,643

(22) Filed: Oct. 1, 2003

(65) Prior Publication Data

US 2005/0040495 A1   Feb. 24, 2005

Related U.S. Application Data

(63) Continuation-in-part of application No. PCT/US02/10402, filed on Apr. 1, 2002.

(60) Provisional application No. 60/281,005, filed on Apr. 2, 2001.

(51) Int. Cl.
*H01L 31/0328* (2006.01)

(52) U.S. Cl. ............... 257/183; 257/197; 257/557; 257/577

(58) Field of Classification Search ........... 257/183, 257/197, 557, 577, 618
See application file for complete search history.

(56) References Cited

U.S. PATENT DOCUMENTS 4,498,092 A * 2/1985 Yamazaki ............... 257/53
5,508,553 A * 4/1996 Nakamura et al. ........ 257/576
6,187,646 B1 * 2/2001 Gris ........................ 438/329
6,429,085 B1 * 8/2002 Pinter ...................... 438/320
6,586,298 B1 * 7/2003 Naem ...................... 438/235
6,657,279 B1 * 12/2003 Pinto et al. ............... 257/557

OTHER PUBLICATIONS

P. Biljanovic, T. Suligoj, "Horizontal Current Bipolar Transistor (HCBT): A New Concept of Silicon Bipolar Transistor Technology", IEEE Trans. on Electron Devices, Nov. 1, 2001, pp 2551-2554, vol. 48.

R. Gomez, R. Bashir, G.W. Neudeck, "On the design and fabrication of novel lateral bipolar transistor in a deep-submicorn technology", Microelectronics Journal, Mar. 2000, pp 199-205, vol. 31.

R. Dekker, P. Baltus, M. Van Deurzen, W V.D. Einden, H. Maas, A. Wagemans, "An Ultra Low-Power RF Bipolar Technology on Glass", International Electron Devices Meeting Tech. Dig., Dec. 1997 pp. 921-923.

(Continued)

*Primary Examiner*—T. N. Quach
(74) *Attorney, Agent, or Firm*—John P. O'Banion (57) ABSTRACT

A bipolar transistor structure for use in integrated circuits where the active device is processed on the sidewall of an n-hill so that the surface footprint does not depend on the desired area of active device region (emitter area). This structure, which is referred to as a Horizontal Current Bipolar Transistor (HCBT), consumes a smaller area of chip surface than conventional devices, thereby enabling higher packing density of devices and/or the reduction of integrated circuit die size. The device is fabricated with a single polysilicon layer, without an epitaxial process, without demanding trench isolation technology, and with reduced thermal budget. Fabrication requires fewer etching processes and thermal oxidations than in conventional devices.

57 Claims, 8 Drawing Sheets

OTHER PUBLICATIONS

H. NII, T. Yamada, K. Inoh, T. Shino, S. Kawanaka, M. Yoshimi, Y. Katsumata, "A Novel Lateral Bipolar Transistor with 67 GHz fmax on Thin-Film SOI for RF Analog Applications" IEEE Trans. Electron Devices, Jul. 2000, pp. 1536-1541, vol. 47.

T. Shiba, Y. Tamaki, T. Onai, Y. Kiyota, T. Kure, T. Nakamura, "A Very Small Bipolar Transistor Technology with Sidewall Polycide Base Electrode for ECL-CMOS LSI's", IEEE Trans. Electron Devices, Sep. 1996, pp. 1357-1363, vol. 43.

S. Konaka, M. Ugajin, T. Matsuda, "Deep Submicrometer Super Self-Aligned Si Bipola Technology with 25.4 ps ECL", IEEE Trans. Electron Devices, Jan. 1994, pp 44-49, vol. 41.

* cited by examiner

HORIZONTAL CURRENT BIPOLAR TRANSISTOR AND FABRICATION METHOD

CROSS-REFERENCE TO RELATED APPLICATIONS

This application claims priority to, and is a 35 U.S.C. § 111(a) and 37 C.F.R. § 1.53(b) continuation-in-part of, co-pending PCT international application serial number PCT/US02/10402 filed on Apr. 1, 2002 which designates the U.S., incorporated herein by reference in its entirety, and which claims priority to U.S. provisional application Ser. No. 60/281,005 filed on Apr. 2, 2001, incorporated herein by reference in its entirety.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

1. Field of the Invention

The present invention pertains generally to bipolar transistor structures, and more particularly to bipolar transistor structures incorporated into integrated circuits.

2. Description of the Background Art

In the current state of the art, mainstream silicon bipolar transistor structures are typically processed using self-aligned, double polysilicon, trench-isolated technology. Although improved over the years, with many new materials and processes introduced, those transistor structures are still based on similar geometry as the first double-diffused, pn-junction isolated, silicon bipolar devices; that is, the placement of electrodes, vertical current flow and interconnection system are basically the same. Heterojunction bipolar transistors are based on the same geometry, as well, although the technology is much different than that of Si/SiGe based devices.

Another family of bipolar structures, those with horizontal current flow, are primarily fabricated in silicon technology and are called lateral bipolar transistors (LBTs). LBTs are mainly processed using silicon-on-insulator (SOI) technology. Those transistors often exhibit inferior high-frequency characteristics compared to state-of-art silicon substrate devices. There are LBT's processed in Si-substrate technology, but they are either lateral pnp transistors or CMOS-process-incorporated npn transistors. Lateral pnp transistors are non-optimized devices processed in npn-based technology with inferior electrical characteristics compared to mainstream npn transistors. CMOS compatible npn LBT's are also non-optimized devices, processed in CMOS-based technology with poor electrical characteristics.

Therefore, there is a need for a bipolar transistor structure that overcomes some of traditional bipolar transistor disadvantages (e.g. complicated technology, large transistor area, inability to scale down), and which can extend the market of bipolar technology. The present invention satisfies those needs, as well as others, and overcomes deficiencies in current bipolar transistor technology.

BRIEF SUMMARY OF THE INVENTION

The present invention comprises a new type of bipolar transistor for use in integrated circuits, which we refer to as a Horizontal Current Bipolar Transistor (HCBT). This inventive HCBT, which is processed by an inventive fabrication method, consumes a smaller area of chip surface, thereby enabling higher packing density of devices and/or the reduction of integrated circuit die size.

By way of example, and not of limitation, in accordance with the present invention the active device is processed on the sidewall of an n-hill so that the HCBT surface footprint does not depend on the desired area of active device region (emitter area). Therefore, large current driving capabilities can be obtained with the minimal consumption of chip surface. Surface reduction is due to the higher ratio of active to total device area, which is approximately 20% to approximately 30% in the HCBT of the present invention compared to approximately 2% to approximately 5% in state of the art vertical current transistors. This ratio cannot be decreased by lithography resolution shrinkage, and in an HCBT it will be improved by a factor of $\lambda^2$ with resolution scaling down by a factor of $\lambda$. By optimizing an HCBT for minimum area, the smallest practical footprint for a given lithography resolution can be achieved. In such a case, the active device is extended in depth. For example, the device area in 0.25/0.1 (resolution/alignment margin) lithography rules is only 2.73 $\mu m^2$ for an emitter area of 0.7 $\mu m^2$.

An HCBT's high frequency characteristics are improved by the reduction of capacitances due to the reduced pn-junction areas and by doping profile engineering. More particularly, the collector-base ($C_{BC}$) and collector-substrate ($C_{CS}$) capacitances are decreased in an HCBT, thereby improving high frequency characteristics of transistor. Additionally, the same doping profiles of the active transistor region can be obtained as in vertical current devices. HCBT structure is planar and its collector and emitter $n^+$ polysilicon layer enables simple integration and device interconnection.

A typical embodiment of a HCBT fabrication process according to the present invention requires only five lithography masks up to one layer of metallization, compared to the six to eight masks typically required by state of art vertical current devices. Furthermore, the present invention offers the possibility of fabricating a self-aligned bipolar device with only three to four masks with the same or even improved electrical performances. In addition, HCBT fabrication requires fewer technological steps that with conventional transistors. For example, an HCBT according to the invention is processed with a single polysilicon layer, without an epitaxial process, without demanding trench isolation technology, and with reduced thermal budget. Fabrication requires about ten fewer etching processes and one or two fewer thermal oxidations than in a typical SST process. This leads to lower production costs and simpler fabrication.

An HCBT structure according to the present invention can extend the applications of silicon bipolar technology to very high-speed circuits. Also, decreased device size and simpler fabrication technology make an HCBT attractive to other applications, which are not typically bipolar. For example, high packing density makes an HCBT attractive for VLSI/ULSI high density digital circuits, which are currently CMOS exclusive. The horizontal current concept will improve $I^2L$ circuit characteristics considerably, increasing speed and possible replacement of CMOS with $I^2L$. Since this technology overcomes some of traditional bipolar transistor disadvantages (e.g. complicated technology, large transistor area, inability to scale down), it can extend the market of bipolar technology.

Further advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus and methods generally shown and described in FIG. 1 through FIG. 6. It will be appreciated that the apparatus may vary as to configuration and as to details of the parts, and that the method may vary as to the specific steps and their sequence, without departing from the basic concepts as disclosed herein.

Figure 1:
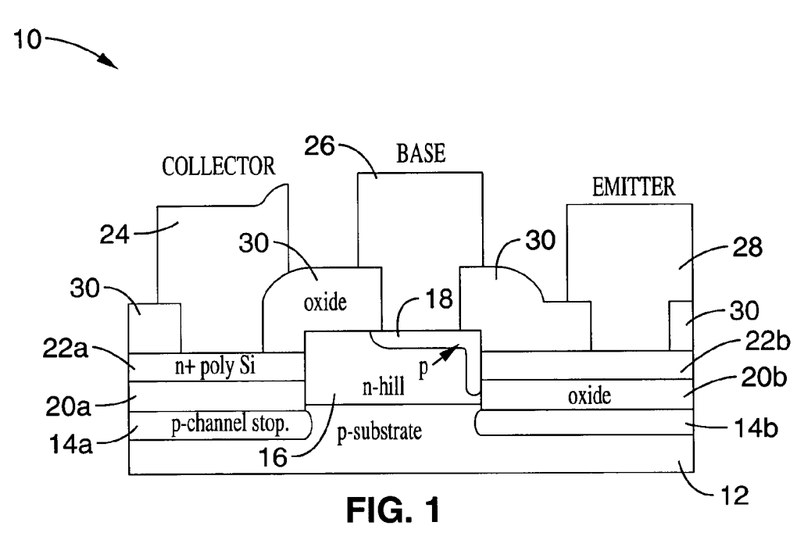
FIG. 1 is a schematic side view in cross-section of a Horizontal Current Bipolar Transistor (HCBT) according to the present invention.
Figure 2:
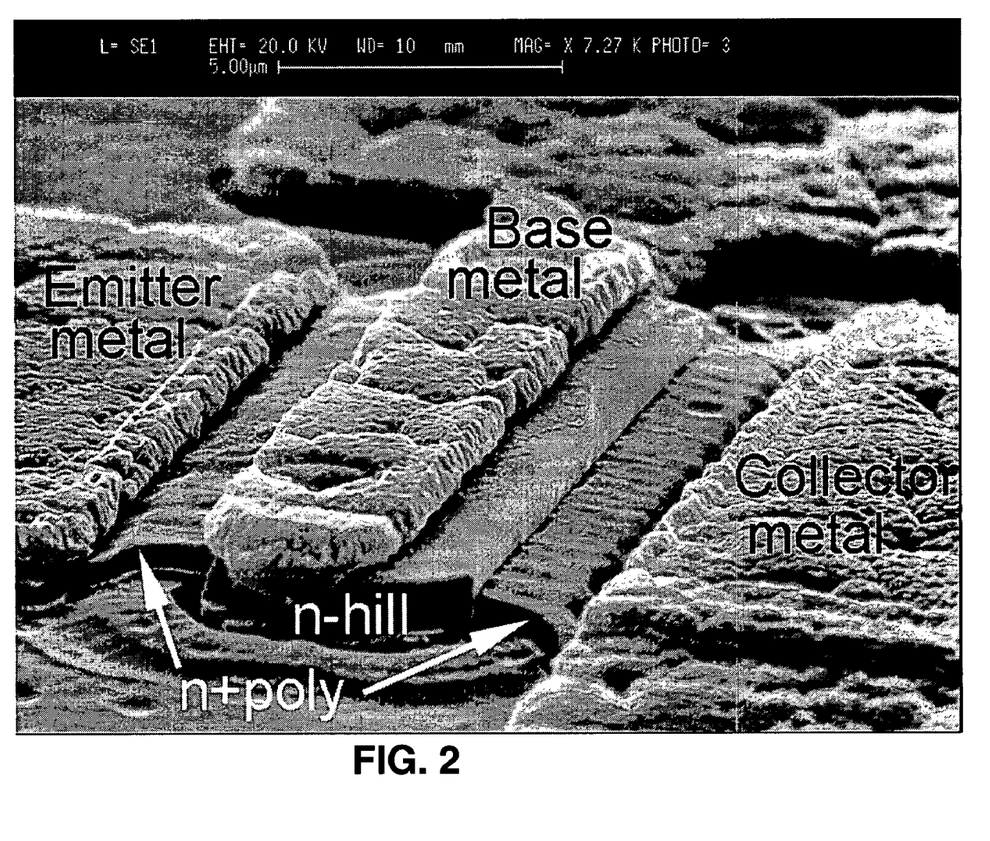
FIG. 2 is an SEM picture of an actual Horizontal Current Bipolar Transistor (HCBT) according to the invention in 1 µm technology, where the passivation oxide has been etched away to expose the active sidewalls of the n-hill.

Referring first to FIG. 1, an embodiment of a Horizontal Current Bipolar Transistor (HCBT) 10 according to the present invention is schematically shown. In the embodiment shown, the device comprises p-type substrate 12, p-channel stoppers 14a, 14b, n-hill 16 with p-region 18, isolation silicon dioxide 20a, 20b, n+ polysilicon 22a, 22b, collector 24, base 26, emitter 28, and surrounding passivation oxide 30. FIG. 2 shows an SEM picture of such an HCBT in 1 µm lithography resolution and provides a perspective view of the device with the passivation oxide etched away so that the active sidewalls are exposed. As can be seen, the base metal extends over one sidewall and a portion of the upper surface of the n-hill, and the emitter metal and collector metal is deposited over the n+ polysilicon regions.

Figure 3:
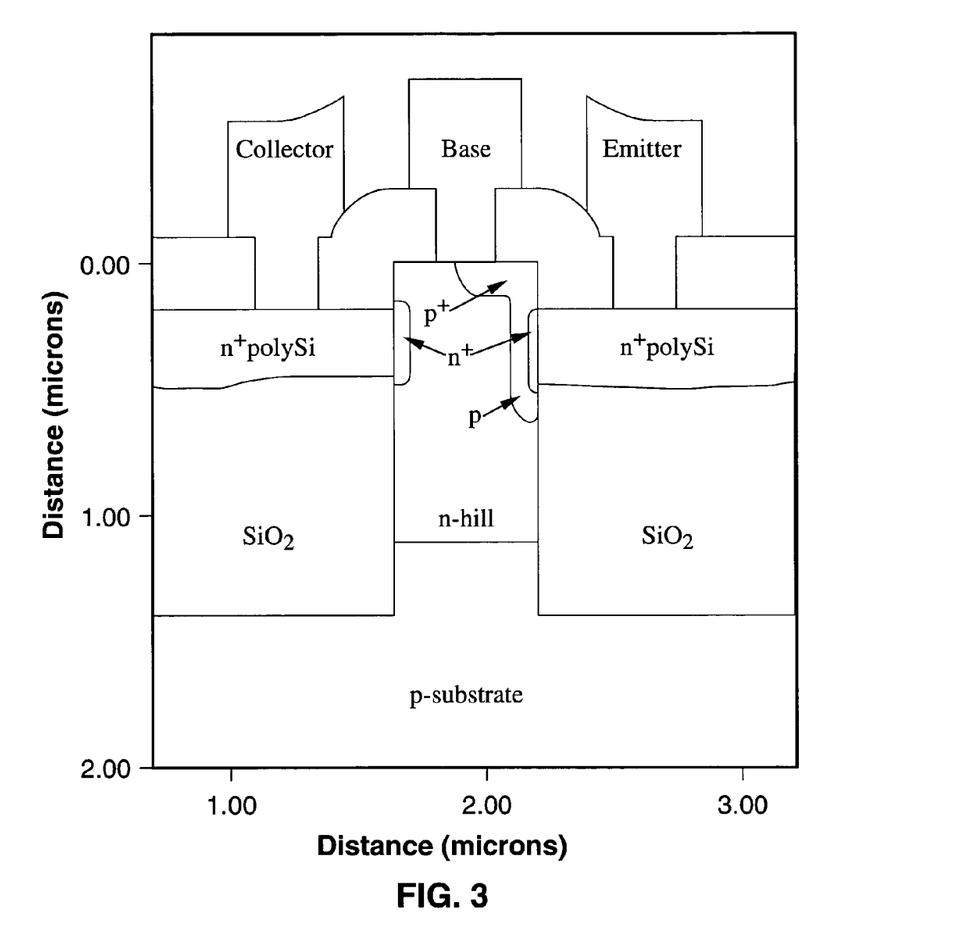
FIG. 3 is a diagram of a simulated Horizontal Current Bipolar Transistor (HCBT) according to the present invention in 0.25 µm technology.
Figure 4:
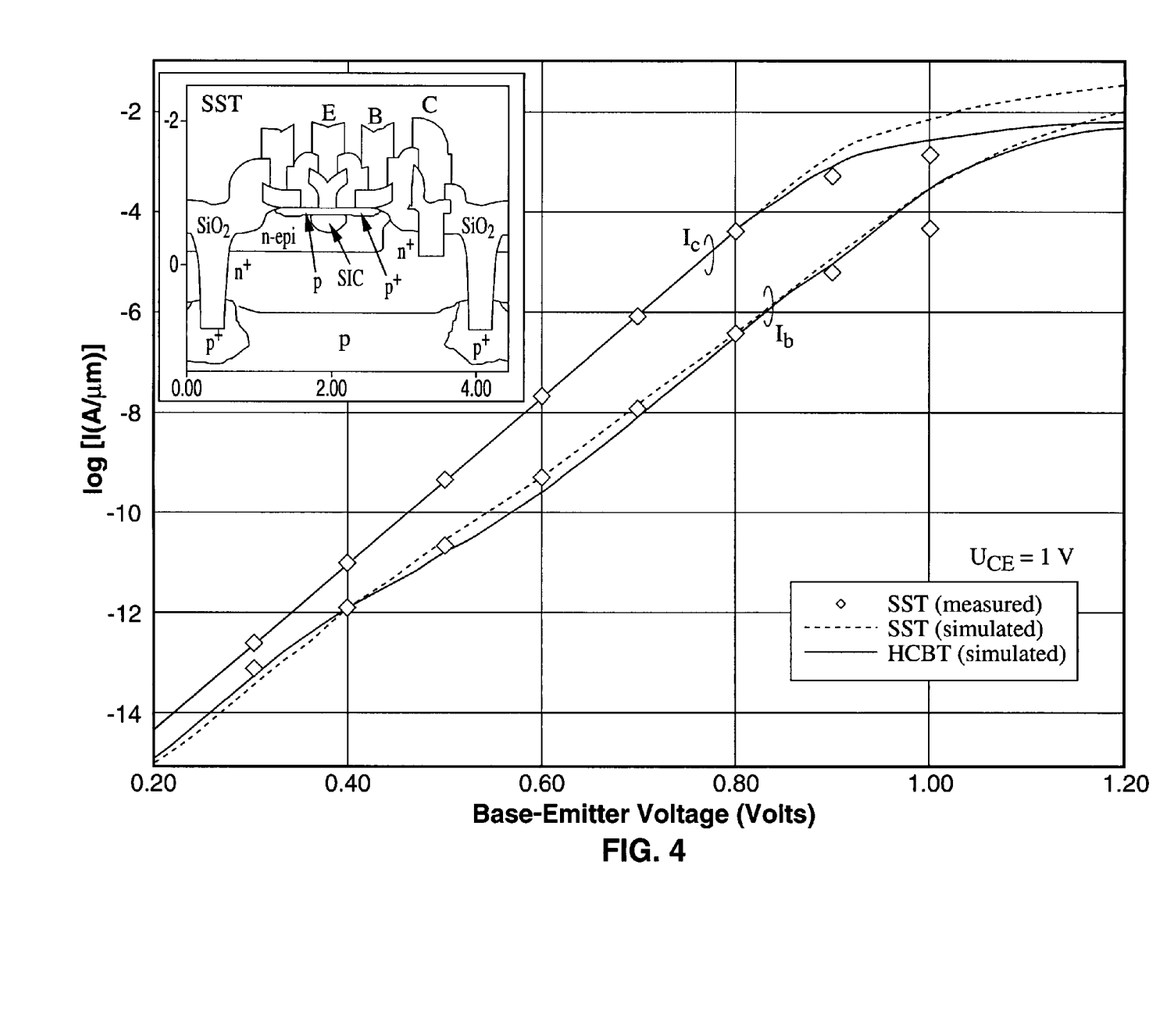
FIG. 4 is a graph showing collector ($I_C$) and base ($I_B$) currents versus base-emitter voltage ($V_{BE}$) for an SST and the HCBT simulation of FIG. 3 for the same emitter area, per emitter length of the HCBT, at a collector-emitter voltage $U_{CE}$=1 V.

FIG. 3 shows an HCBT according to the present invention simulated in 0.25 µm lithography resolution. The electrical characteristics of the HCBT was examined and compared to a modern, state of art Super-Self Aligned Transistor (SST), simulated assuming the same design rules and doping profiles of the active transistor region. Simulation model parameters were set according to experimental data and are applied to both the HCBT and SST structures. Gummel plots of both structures are depicted in FIG. 4. In the HCBT structure, note that the base is one-side contacted, and the base resistance ($R_B$) is higher than in two-side contacted SST structure. The influence of higher base resistance can be observed at higher currents in FIG. 4.

Figure 5:
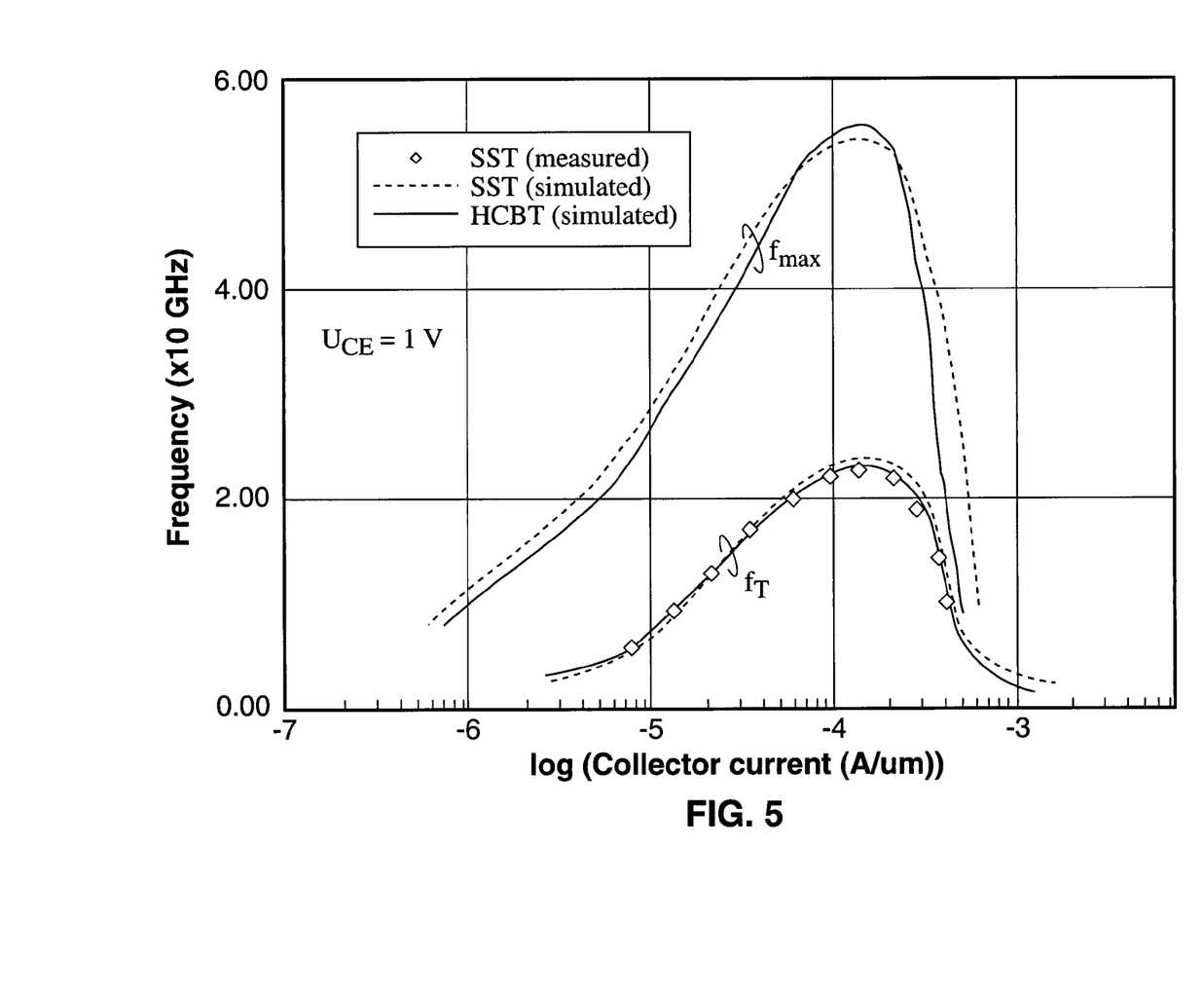
FIG. 5 is a graph showing cutoff frequency ($f_T$) and maximum frequency of oscillations ($f_{max}$) versus collector current ($I_C$) of an SST and the HCBT simulation of FIG. 3, at collector-emitter voltage $U_{CE}$=1V, where the emitter height of the HCBT is $h_E$=0.3 µm and the emitter width of the SST is $w_E$=0.25 µm.

To justify the effect of base resistance, high-frequency characteristics have been simulated. FIG. 5 shows that the same cut-off frequency ($f_T$) and maximum frequency of oscillations ($f_{max}$) are obtained for the HCBT's emitter height $h_E$=0.3 µm, which is larger than SST's emitter width ($w_E$=0.25 µm). This means that reduction of collector-base capacitance ($C_{BC}$) is dominant over the increase of $R_B$. For smaller emitter heights, $f_T$ and $f_{max}$ are higher for the HCBT structure than those of the SST. The compensation of the increased $R_B$ by reduced $C_{BC}$ is even more pronounced in the three-dimensional considerations of HCBT and SST structures since parasitic parts have smaller volume in HCBT. Also, this effect will be more pronounced by further lithography scaling.

Additionally, $R_B$ can be decreased by contacting the base at the front and back sides of emitter n+ polysilicon. This technology, called a self-aligned HCBT will decrease $R_B$ to the same value as in SST structures. It would result, in addition to reduced $C_{BC}$, in superior high frequency characteristics, still maintaining other HCBT advantages.

One of the advantages of the HCBT structure of the present invention is that it can be processed by different technological steps and parameters (use of different processes, process parameters, and the sequence of process steps) that can vary depending on transistor's purpose, desired device properties, process complexity, etc. In developing a preferred fabrication process, different HCBT technologies were examined using TSUPREM 4, a two-dimensional process simulation program, assuming lithography resolution in the range of 1 µm to 0.25 µm and mask alignment tolerances in the range of 1 µm to 0.1 µm. Moreover, different structures were experimentally verified by applying 1 µm lithography resolution and alignment tolerances in the range of 1 µm to 0.3 µm.

Figure 6A:
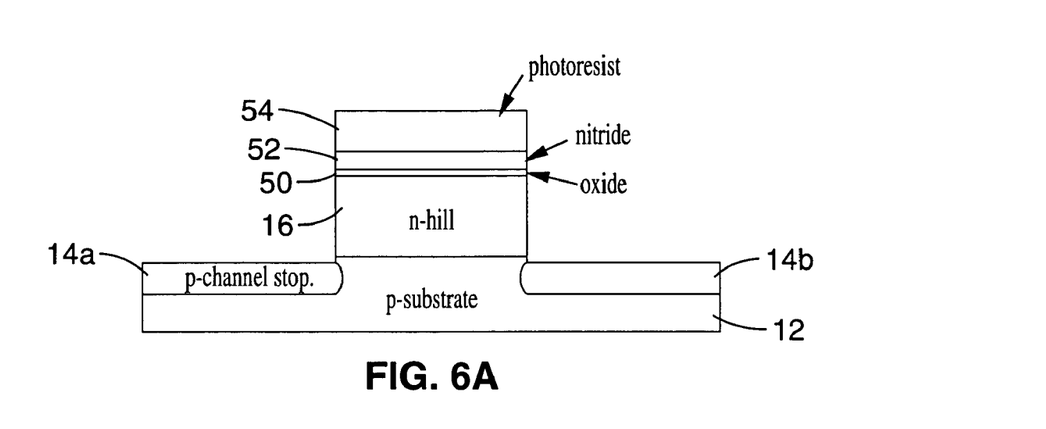
FIG. 6A through FIG. 6F is a flow diagram schematically illustrating an embodiment of a fabrication process for the Horizontal Current Bipolar Transistor (HCBT) shown in FIG. 1.

Referring now to FIG. 6A through FIG. 6F, an embodiment of a process for fabricating the HCBT device shown in FIG. 1 can be seen. Referring first to FIG. 6A, the HCBT of the present invention is preferably fabricated using a commercially available p-type wafer with resistivity of approximately 1–20 Ω-cm as the p-substrate 12 for the device. As an initial step in the process, a collector n-region is established by conventional high-energy phosphorus ion implantation. Next, an oxide buffer layer 50 is formed over the surface of the wafer by thermal oxidation at approximately 850° C. for approximately six minutes in a dry $O_2$ atmosphere. The wafer is then additionally annealed at high temperature (≈1050° C.), so that the phosphorus atoms are redistributed.

Note that parameters of the foregoing phosphorus ion implantation and annealing steps are set to achieve the desired doping profile in the collector region, taking into account that it affects device performance and should be designed in accordance with particular device application. These steps are equivalent to buried layer ion implantation, epitaxial growth and selective collector implantation in conventional Super Self-Aligned Transistor (SST) fabrication.

An n-hill cap layer is then formed by deposition of a silicon nitride film 52 over the oxide layer 50. However, other cap layer materials can be used as well, such as polysilicon, oxinitride, metals, etc., with or without buffer oxide. Photoresist 54 is then deposited over the nitride layer and patterned by a lithography mask. The nitride-oxide double layer is then selectively removed, and the n-doped silicon is anisotropically etched in a way that p-substrate 12 is reached and the isolated n-hill 14 is established. Next, p-channel stoppers 14a, 14b are formed by, for example, implanting boron ions at zero degrees, to increase p-type doping in the field around the n-hill to prevent inversion channel formation and collector-collector shorts. The n-hill is protected from ion penetration during the channel stopper formation by the nitride-oxide cap layer that remains due to selective patterning.

At this point, the structure appears as shown in FIG. 6A where portions of the layers of oxide 50, nitride 52 and photoresist 54 cap the n-hill 16.

Note that special attention has been paid to processing a high-quality sidewall surface on the n-hill where the active transistor region will be formed. Note that the photoresist's edge roughness is transferred to the n-hill sidewall by the etching process. A photoresist edge is inherently rough due to the finite dimensions of polymers that form photoresist. Such roughness is amplified by polymer aggregation process and presents limitation of HCBT, as well as of all pillar-like devices. In addition, in dry etching, sidewall defects could be caused by ions striking the sidewall surface. Accordingly, in the HCBT fabrication process of the present invention, sidewall roughness is minimized by several means: (i) the optimization of photoresist treatment (thickness, baking, exposure and development parameters), (ii) the use of wet etching processes (both crystallographic dependent or isotropic), or (iii) thermal oxidation. Satisfactory roughness levels for shallow junctions processing has been obtained in this manner.

Figure 6B:
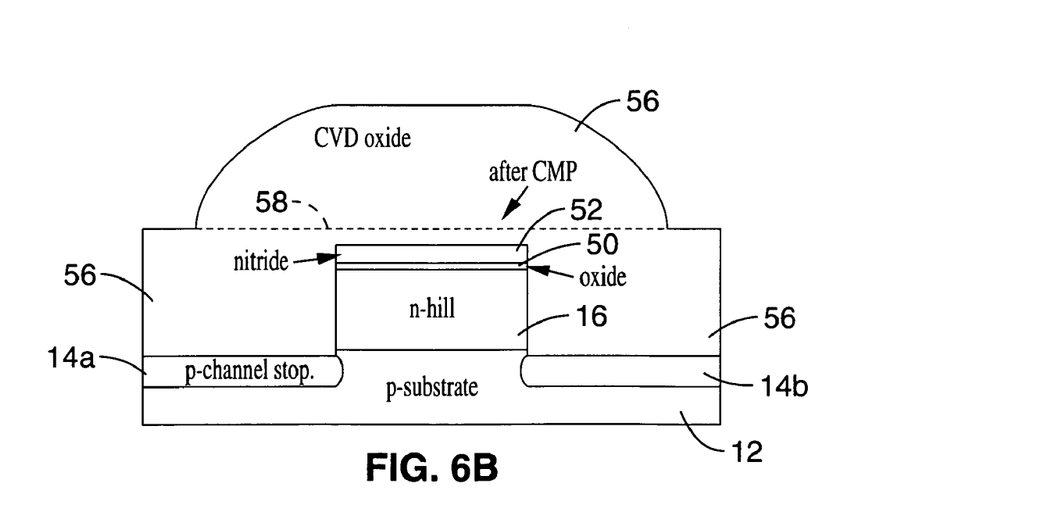
Figure 6C:
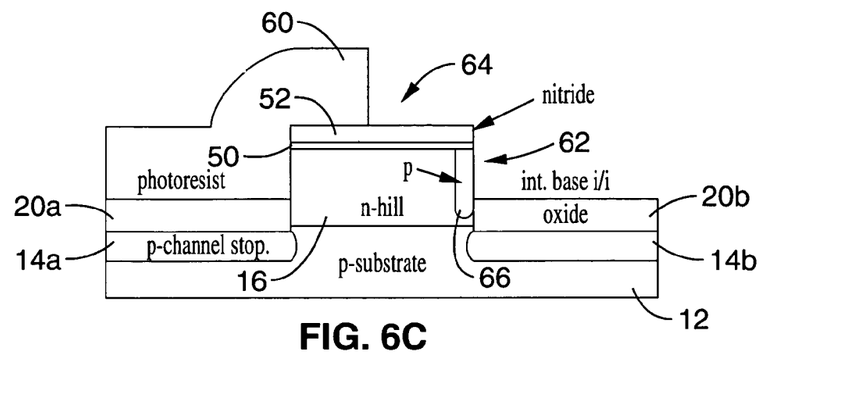

Next, isolation oxide 56 (e.g., silicon dioxide) is deposited using chemical vapor deposition (CVD) or the like and chemically-mechanically planarized (CMP) to the area of line 58 as shown in FIG. 6B, and etched back as shown in FIG. 6C. In this "CMP and etch-back" technique, isolation between n-hills is achieved without the use of silicon-on-insulator (SOI) substrates. Note that the CMP step can be eliminated in the case of high packing density and closer placement of the n-hills or by using some other planarization technique. Furthermore, the revealed sidewall surface of the n-hill defines the active transistor region area and could be adjusted according to desired transistor applications.

At this point, protection thermal oxidation can be carried out. Note, however, that isolation oxide densification can be carried out either after deposition or after the etch-back step.

Photoresist is then deposited and patterned by a second lithography mask. This photoresist defines intrinsic and extrinsic base regions 62, 64, respectively, which are both ion implanted, so the photoresist process steps should be designed to ensure good implantation masking properties.

Next, the intrinsic base region 62 is angle-implanted and segment 66 of p-region 18 is formed on one side on the n-hill 16, as shown in FIG. 6C. The process is self-aligned by adjusting wafer tilt and rotation angles to protect the back and front sides of n-hill 16 from p-type doping. Also, angled ion implantation is advantageous since the larger volume of neutral base is formed beneath the level of isolation oxide, protecting the structure from the formation of depletion or inversion channels near the $Si$—$SiO_2$ interface and emitter-collector punchthrough in that region. Analysis has shown that boron diffusion can also be used as base-doping process. In that case, additional ion implantation can be done to increase the doping in the bottom of base. Alternatively, the intrinsic base can be grown on the n-hill sidewall by an epitaxial process. If the intrinsic base is ion-implanted, it can be done prior to the deposition of photoresist since this process is self-aligned to the n-hill sidewall anyway. In that way, the possible contamination from photoresist during implantation is avoided.

Figure 6D:
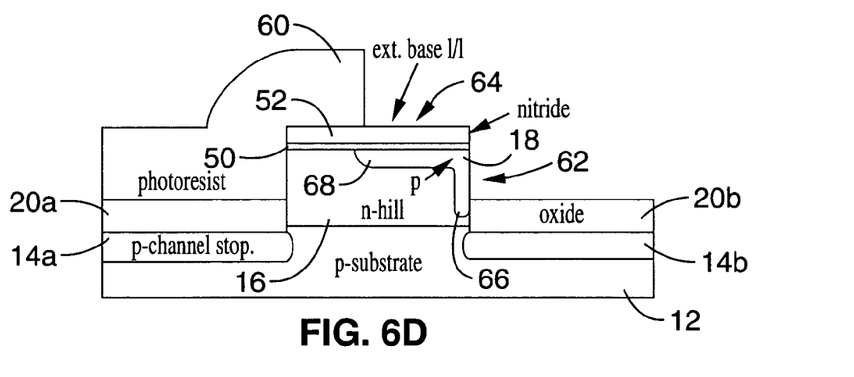

Next, the extrinsic base region 64 is implanted on the upper surface of n-hill 16 using the same mask, but the boron concentration on the top of n-hill 16 is increased to reduce base resistance. In this way, segment 68 of p-region 18 is formed on the top of the n-hill 16, as shown in FIG. 6D. For this process, a wafer is angled in opposite direction than for the intrinsic base implant to protect intrinsic base sidewall from additional doping.

Figure 6E:
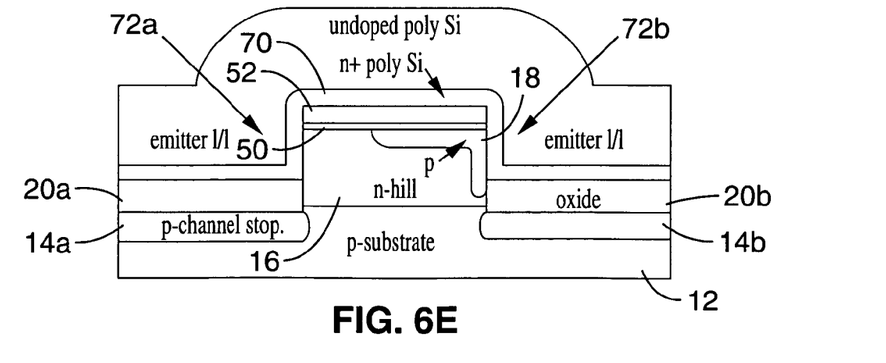

Referring now to FIG. 6E, photoresist 60 is then removed and the collector and emitter polysilicon is deposited. Either in-situ doped or ion implanted doping methods can be used for the collector and emitter $n^+$ polysilicon layers. In the case of ion implanted polysilicon, a thin polysilicon layer 70 is first deposited and the collector and emitter regions are separately implanted at symmetrical tilt angles 72a, 72b, respectively. Then additional undoped polysilicon 74 is deposited. Occasionally, the deposition-implantation-deposition process can be repeated to improve uniformity of $n^+$ polysilicon doping profile, e.g., for relatively thicker active polysilicon films. Such a multi-step approach improves perimeter depletion and emitter plug effects and enables the same emitter doping profile at different heights on the n-hill sidewall. In the case of in-situ doping technique, only one deposition is required.

Figure 6F:
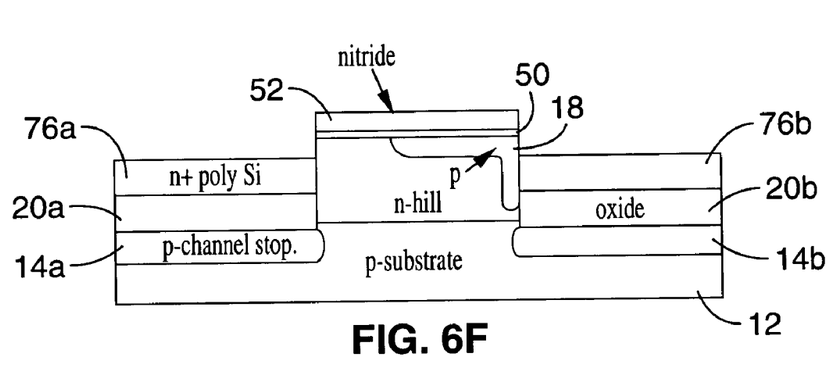

Next, as shown in FIG. 6F, the polysilicon is chemically-mechanically planarized and etched-back thereby defining the collector and emitter $n^+$ polysilicon layers 76a, 76b, respectively. Note that the etching process has to be selective to the p-type monocrystalline base region. Both dry and wet selective etch chemistries can be used to remove surrounding polysilicon film and leave the base intact. The final polysilicon thickness determines the electrical parameters of transistor, such as, active device area, emitter resistance, base resistance, emitter-base capacitance and breakdown voltage. Note that better controllability of emitter-extrinsic base distance can be achieved if another CMP is performed after a passivation oxide deposition. In this case, the emitter-extrinsic base distance is determined by the passivation oxide thickness and the extrinsic base is implanted after that CMP. The final device application and the optimization of certain device parameters dictate polysilicon thickness and technology, as well as other process parameters.

A third mask is used to remove polysilicon from the front and back sides of the n-hill 16 and to define the emitter and collector active regions. Either hard mask (e.g. oxide, nitride) or photoresist can be employed.

Next, oxide layer 50 and nitride film 52 can be etched away and passivation oxide 30 deposited. Annealing and emitter drive-in diffusion is then carried out. Then, fourth and fifth masks are used for contact hole definition and metallization to yield the device illustrated in FIG. 1.

Note that, in order to decrease the series resistances, suicides can be used in self-aligned process to decrease the extrinsic base, emitter and collector sheet resistances before metallization using sidewall spacer on the n-hill sidewalls.

Additionally, hydrogen passivation can be carried out to improve Si—SiO$_2$ interface properties. This is useful in an HCBT structure to decrease Shockley-Read-Hall recombination current at the intrinsic base sidewall surface since the intrinsic base is not completely surrounded by highly doped extrinsic base.

Although the description above contains many details of the invention, these should not be construed as limiting the scope of the invention but as merely providing illustrations of some of the presently preferred embodiments of this invention. It will be appreciated from the foregoing that alternative embodiments are contemplated within the scope of the invention as well.

In one embodiment the substrate comprises a single crystalline material, such as a p or n doped single crystalline wafer, or a substrate of SOI (Silicon-On Insulator). For example, a (110) silicon wafer can be used as a substrate, which makes it possible to use crystallographic dependent etching for the minimization of the n-hill sidewall roughness. The flat and smooth sidewalls can be obtained, corresponding to the (111) crystal planes, that are perpendicular to the surface in (110) wafers. Accordingly, this embodiment beneficially offers decreased sidewall roughness and further offers etch protection of the sidewall.

Furthermore, the active sidewall can be aligned to (100) crystal plane as well, which is also perpendicular to the surface in (110) wafers.

Also, the HCBT structure can be processed without nitride layer, if the extrinsic base p+ region is implanted and activated before the deposition or doping of polysilicon. The p+ extrinsic base protects the n-hill, if crystallographic dependant etchant is used for polysilicon etch, since it etches p+ silicon/polysilicon extremely slowly. Such a structure can result in the reduced collector-base capacitance and increased breakdown voltage if a part of the n-hill is etched from the top during polysilicon etching.

Note also that the fabrication process is compatible with Silicon-On-Insulator (SOI) substrates. In that case, the buried oxide in SOI serves as the isolation oxide, which is processed by the CMP and etch-back in the presented process.

Additionally, the base, which is implanted in the n-hill sidewall, can be processed by the epitaxial growth, either silicon or silicon-germanium, either before or after isolation oxide process. The high-quality films can be formed by the epitaxial growth due to the low-defect (111) sidewalls when (110) wafers are used as HCBT substrate. Such a process can offer a further degree of optimization of HCBT structure.

Based on the foregoing description, it will also be appreciated that the HCBT technology of the present invention is suitable for the integration with pillar-like CMOS devices and other devices to achieve system-on-chip and/or BiCMOS integration. The active sidewalls of the CMOS transistors can be aligned either to (100) or to (111) crystal planes thus achieving optimized device performance, e.g. pMOS to (111) crystal planes and nMOS to (100) crystal planes for the maximum channel mobility. Note also that this invention can be used in all of the applications of existing bipolar junction devices. For example, in addition to silicon IC's, the invention can be applied to SiGe and other compound semiconductor technologies. Also, various types of junction devices can be fabricated in this way, including pn, npn, pnp, pin, pip junction devices and the like by simply selecting the desired materials (e.g., Group II, III, IV, V, and VI and quaternaries and tertiaries thereof) and corresponding dopants. Typical bipolar applications include high speed digital (ECL, CML, I$^2$L) circuits, wireless and communication technologies, high frequency electronics, BiCMOS, analog circuits, etc. Furthermore, the invention can be applied to MOS technology-based circuits since the HCBT technology described herein overcomes some of the traditional bipolar technology disadvantages, such as: complicated and expensive technology, large foot print of transistor, unimprovement of device performance with shrinking lithography resolution. Moreover, HCBT technology can reach higher device per area and logic function per area density in comparison to today's dominant CMOS technology, still maintaining bipolar advantages that is higher speed of operation. Furthermore, HCBT technology is suitable for vertical BiCMOS circuits. This can offer many improvements to BiCMOS circuits used currently in all high-speed communication applications.

Therefore, it will be appreciated that the scope of the present invention fully encompasses other embodiments which may become obvious to those skilled in the art, and that the scope of the present invention is accordingly to be limited by nothing other than the appended claims, and their legal equivalents, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A semiconductor bipolar junction device, comprising:
   a substrate of semiconductor material having desired crystalline orientation;
   a first semiconductor material extending substantially vertically from said substrate to form a hill having the same crystalline orientation as said substrate;
   said first material having a sidewall and an upper surface; and
   a second material implanted or diffused into a portion of said sidewall and to at least a portion of said upper surface of said first material;
   wherein a bipolar junction is formed between said first and second materials.

2. A semiconductor junction device as recited in claim 1, further comprising:
   a first electrical contact connected to said first material; and
   a second electrical contact connected to said second material.

3. A semiconductor junction device as recited in claim 1, wherein said junction comprises a pn junction.

4. A semiconductor junction device as recited in claim 1, wherein said junction comprises an in junction.

5. A semiconductor junction device as recited in claim 1, wherein said junction comprises an pi junction.

6. A semiconductor junction device as recited in claim 1, wherein said second material is implanted or diffused into an upper portion of a first sidewall of said first material and an adjoining portion of said upper surface of said first material.

7. A semiconductor junction device as recited in claim 1, further comprising:
a stopper region formed on the top of said substrate around said hill of said first material;
an isolation region deposited or formed over said stopper region; and
at least two polysilicon regions deposited over said isolation region and adapted for receiving electrical contacts.

8. A semiconductor junction device as recited in claim 1, wherein said substrate comprises silicon or silicon-an-insulator.

9. A semiconductor junction device as recited in claim 1, wherein said first material comprises a portion of said substrate which has been doped and about which substrate material has been etched away leaving said hill of said first material.

10. A semiconductor bipolar junction device, comprising:
a substrate of semiconductor material having a desired crystalline orientation;
a first semiconductor material extending substantially vertically from said substrate to form a hill having the same crystalline orientation as said substrate;
said first material having at least an upper portion doped with a first impurity;
said first material having a sidewall and an upper surface; and
a second material implanted or diffused into a portion of said sidewall and to at least a portion of said upper surface of said first material;
wherein a bipolar junction is formed between said first and second materials.

11. A semiconductor junction device as recited in claim 10, further comprising:
a first electrical contact connected to said first material; and
a second electrical contact connected to said second material.

12. A semiconductor junction device as recited in claim 10, wherein said junction comprises a pn junction.

13. A semiconductor junction device as recited in claim 10, wherein said junction comprises an in junction.

14. A semiconductor junction device as recited in claim 10, wherein said junction comprises a pi junction.

15. A semiconductor junction device as recited in claim 10, wherein said second material is implanted or diffused into an upper portion of a first sidewall of said first material and an adjoining portion of said upper surface of said first material.

16. A semiconductor junction device as recited in claim 10, further comprising:
a stopper region formed on the top of said substrate around said hill of said first material;
an isolation region deposited or formed over said stopper region; and
at least two polysilicon regions deposited over said isolation region and adapted for receiving electrical contacts.

17. A semiconductor junction device as recited in claim 10, wherein said substrate comprises silicon or silicon-on-insulator.

18. A semiconductor junction device as recited in claim 10, wherein said first material comprises a portion of said substrate which has been doped and about which substrate material has been etched away leaving said hill of said first material.

19. A semiconductor bipolar junction device, comprising:
a substrate of semiconductor material having a desired crystalline orientation;
a first material extending substantially vertically from said substrate to form a hill having the same crystalline orientation as said substrate;
said first material having a sidewall and an upper surface; and
wherein an upper portion of said first semiconductor material has been doped with a different type doping than that of the substrate;
a second;
material implanted or diffused into at least a portion of said sidewall and to at least a portion of said upper surface of said first material;
wherein a bipolar junction is formed between said first and second materials.

20. A semiconductor junction device as recited in claim 19, further comprising:
a first electrical contact connected to said first material; and
a second electrical contact connected to said second material.

21. A semiconductor junction device as recited in claim 19, wherein said junction comprises a pn junction.

22. A semiconductor junction device as recited in claim 19, wherein said junction comprises an in junction.

23. A semiconductor junction device as recited in claim 19, wherein said junction comprises a pi junction.

24. A semiconductor junction device as recited in claim 19, wherein said second material is implanted or diffused into an upper portion of a first sidewall of said first material and an adjoining portion of said upper surface of said first material.

25. A semiconductor junction device as recited in claim 19, further comprising:
a stopper region formed on the top of said substrate around said hill of said first material;
an isolation region deposited or formed over said stopper region; and
at least two polysilicon regions deposited over said isolation region and adapted for receiving electrical contacts.

26. A semiconductor junction device as recited in claim 19, wherein said substrate comprises silicon or silicon-on-insulator.

27. A semiconductor junction device as recited in claim 19, wherein said first material comprises a portion of said substrate which has been doped and about which substrate material has been etched away leaving said hill of said first material.

28. A semiconductor junction device as recited in claim 19:
wherein said substrate is of p-type material;
wherein the upper portion of said first material is doped with an n-dopant; and
wherein said second material comprises a p-type dopant.

29. A semiconductor bipolar junction device, comprising:
a substrate of semiconductor material having a desired crystalline orientation and a first donor impurity type;
a first semiconductor material extending substantially vertically from said substrate to form a hill having the same crystalline orientation as said substrate;
said first material having a sidewall and an upper surface; and wherein an upper portion of said first semiconductor material is doped with a second donor impurity type;
a second;
material of said first donor impurity type implanted or diffused into at least a portion of said sidewall and to at least a portion of said upper surface of said first material;
wherein a bipolar junction is formed between said first and second materials.

30. A semiconductor junction device as recited in claim 29, further comprising:
a first electrical contact connected to said first material; and
a second electrical contact connected to said second material.

31. A semiconductor junction device as recited in claim 29, wherein said junction comprises a pn junction.

32. A semiconductor junction device as recited in claim 29, wherein said junction comprises an in junction.

33. A semiconductor junction device as recited in claim 29, wherein said junction comprises a pi junction.

34. A semiconductor junction device as recited in claim 29, wherein said second material is implanted or diffused into an upper portion of a first sidewall of said first material and an adjoining portion of said upper surface of said first material.

35. A semiconductor junction device as recited in claim 29, wherein said donor impurity types comprise p-dopants and n-dopants.

36. A semiconductor junction device as recited in claim 29, further comprising:
a stopper region formed on the top of said substrate around said hill of said first material;
an isolation region deposited or formed over said stopper region; and
at least two polysilicon regions deposited over said isolation region and adapted for receiving electrical contacts.

37. A semiconductor junction device as recited in claim 29, wherein said substrate comprises silicon or silicon-on-insulator.

38. A semiconductor bipolar junction device, comprising:
a substrate of semiconductor material having a desired crystalline orientation;
a first material extending substantially vertically from said substrate to form a hill of semiconductor material having the same crystalline orientation as said substrate;
wherein an upper portion of said first material is doped with a different type doping than that of the substrate;
said first material having a sidewall and an upper surface;
a second;
material implanted or diffused into at least a portion of said sidewall and to at least a portion of said upper surface of said first material;
wherein a bipolar junction is formed between said first and second materials;
a doped polysilicon region in contact with one or more sidewalls of said first and/or second material and configured for receiving electrical contacts.

39. A semiconductor junction device as recited in claim 38, further comprising:
a first electrical contact connected to said first material; and
a second electrical contact connected to said second material;
wherein said first and second electrical contacts are connected directly or through said doped polysilicon.

40. A semiconductor junction device as recited in claim 38, wherein said junction comprises a pn junction.

41. A semiconductor junction device as recited in claim 38, wherein said junction comprises either an in or pi junction.

42. A semiconductor junction device as recited in claim 38, wherein said second material is implanted or diffused into an upper portion of a first sidewall of said first material and an adjoining portion of said upper surface of said first material.

43. A semiconductor junction device as recited in claim 38, wherein said isolation regions comprise oxide.

44. A semiconductor junction device as recited in claim 38, further comprising a stopper region disposed above said substrate.

45. A semiconductor junction device as recited in claim 38, further comprising an isolation region deposited or formed over said substrate region, or over a stopper region disposed above said substrate.

46. A semiconductor bipolar junction device, comprising:
a substrate of semiconductor material having a desired crystalline orientation and a first donor impurity type;
a first material extending substantially vertically from said substrate to form a hill of semiconductor material having the same crystalline orientation as said substrate;
wherein said first material comprises a portion of said substrate which remains after adjacent portions of substrate material have been etched away;
wherein an upper portion of said first material is doped with a second donor impurity type;
said first material having a sidewall and an upper surface; and
a second material;
said second material comprising a dopant of said first donor impurity type;
said second material implanted or diffused into an upper portion of a first said sidewall and an adjoining portion of said upper surface of said first material;
wherein a bipolar junction is formed between said first and second materials.

47. A semiconductor junction device as recited in claim 46, further comprising:
a first electrical contact connected to said first material; and
a second electrical contact connected to said second material.

48. A semiconductor junction device as recited in claim 46, wherein said junction is selected from the group of junction types consisting of pn, ni, pi, and pin junctions.

49. A semiconductor junction device as recited in claim 46, further comprising:
a stopper region formed on the top of said substrate around said hill of said first material;
an isolation region deposited or formed over said stopper region; and
at least two polysilicon regions deposited over said isolation region and adapted for receiving electrical contacts.

50. A semiconductor junction device as recited in claim 46, wherein said substrate comprises silicon or silicon-on-insulator.

51. A semiconductor bipolar junction device, comprising:
a substrate of semiconductor material having a desired crystalline orientation;

a first semiconductor material extending substantially vertically from said substrate to form a hill having the same crystalline orientation as said substrate;

wherein said first material comprises a portion of said substrate which remains after adjacent portions of substrate material have been etched away;

wherein an upper portion of said first semiconductor material has been doped;

said first material having a sidewall and an upper surface;

a second;

material implanted or diffused into an upper portion of a first said sidewall and an adjoining portion of said upper surface of said first material;

wherein a bipolar junction is formed between said first and second materials;

at least one stopper region formed on the upper portion of said substrate around said hill;

at least one isolation region formed over said at least one stopper region; and at least two polysilicon regions formed over said isolation regions and in contact with said first and second materials;

said polysilicon regions being configured for receiving contacts for establishing electrical connection to said bipolar junction.

52. A semiconductor junction device as recited in claim 51, further comprising:

a first electrical contact connected to said first material; and a second electrical contact connected to said second material;

wherein said first and second electrical contacts are connected directly or through said doped polysilicon.

53. A semiconductor junction device as recited in claim 51, wherein said junction is selected from the group of types junction consisting of pn, ni, pi and pin junctions.

54. A semiconductor junction device as recited in claim 51, wherein said stoppers comprise p-channel stopper regions.

55. A semiconductor junction device as recited in claim 51, wherein said isolation regions comprise oxide.

56. A semiconductor junction device as recited in claim 51, further comprising:

a base contact for the bipolar junction device formed in electrical connection with the top surface of said hill of said first material;

an emitter contact for the bipolar junction device formed in electrical connection through one of said polysilicon regions with said sidewall of said second material; and a collector contact for the bipolar junction device formed in electrical connection through one of said polysilicon regions with a side surface of said hill of said first material which has not been implanted or diffused with said second material.

57. A semiconductor junction device as recited in claim 56, further comprising passivation regions configured for surrounding one or more of said base, emitter and collector contacts.

* * * * *